(12) United States Patent
Matsuyama

(10) Patent No.: US 7,691,554 B2
(45) Date of Patent: Apr. 6, 2010

(54) IMAGE FORMING METHOD AND IMAGE DISPLAY BODY

(75) Inventor: Tetsuya Matsuyama, Tokyo (JP)

(73) Assignee: DAI Nippon Printing Co., Ltd., Tokyo-to (JP)

( * ) Notice: Subject to any disclaimer, the term of this patent is extended or adjusted under 35 U.S.C. 154(b) by 126 days.

(21) Appl. No.: 11/911,733

(22) PCT Filed: Apr. 12, 2006

(86) PCT No.: PCT/JP2006/307720

§ 371 (c)(1),
(2), (4) Date: Nov. 30, 2007

(87) PCT Pub. No.: WO2006/115054

PCT Pub. Date: Nov. 2, 2006

(65) Prior Publication Data

US 2008/0199803 A1 Aug. 21, 2008

(30) Foreign Application Priority Data

Apr. 18, 2005 (JP) ............................. 2005-119655

(51) Int. Cl.
 G03F 7/00 (2006.01)
 G03F 1/14 (2006.01)
(52) U.S. Cl. ..................... 430/200; 430/199; 430/270.1; 430/952

(58) Field of Classification Search ................. 430/199, 430/200, 270.1, 952
See application file for complete search history.

(56) References Cited

U.S. PATENT DOCUMENTS

| 5,132,812 | A | * | 7/1992 | Takahashi et al. | ............... 359/9 |
|---|---|---|---|---|---|
| 6,835,948 | B2 | * | 12/2004 | Woontner | ..................... 257/21 |
| 6,984,281 | B2 | * | 1/2006 | Oshima et al. | ............... 156/235 |
| 2001/0028485 | A1 | * | 10/2001 | Kremen | ........................ 359/31 |
| 2004/0254074 | A1 | * | 12/2004 | Awano et al. | ................ 503/227 |

FOREIGN PATENT DOCUMENTS

| JP | 08-123299 | 5/1996 |
|---|---|---|
| JP | 09-272255 | 10/1997 |
| JP | 2001-010231 | 1/2001 |
| WO | WO 97/47481 | 12/1997 |

OTHER PUBLICATIONS

Machine translation of JP 2001-10231 (2001).*

* cited by examiner

*Primary Examiner*—Amanda C. Walke
(74) *Attorney, Agent, or Firm*—Ladas & Parry LLP

(57) ABSTRACT

An image forming method of forming a full-color image in which black can be expressed in addition to a color expressed by diffracted light. Each of plural diffraction gratings R, G, and B is transferred onto a base material from a transfer sheet in which the plural diffraction gratings R, G, and B are laminated, and the plural diffraction gratings R, G, and B are different from one another in a color of diffracted light observed in a particular direction. A black ink layer constituted by black ink is formed on the base material. Thereby, a color image is formed on the base material, in which a color to be expressed of each pixel is expressed by a combination of luminances of colors corresponding to the diffraction gratings R, G, and B and the black ink.

6 Claims, 6 Drawing Sheets

A

IMAGE FORMING METHOD AND IMAGE DISPLAY BODY

TECHNICAL FIELD

The present invention relates to an image forming method of forming a color image including a light diffraction structure and an image display body formed by the image forming method.

BACKGROUND ART

There is already known an image forming method, wherein a color image (hereinafter sometimes referred to as "color diffraction grating image") including a diffraction grating is formed by transferring each diffraction grating onto a transferred medium from a transfer sheet in which plural diffraction gratings are formed, the diffracted lights of the plural diffraction gratings differ from one another in a particular observation direction (for example, see Patent Documents 1 and 2).

Patent Document 1: Japanese Patent Application Laid-Open No. H08-123299

Patent Document 2: Japanese Patent Application Laid-Open No. H09-272255

DISCLOSURE OF THE INVENTION

Problem to be Solved by the Invention

Black cannot be expressed in color expression by a color expression using diffracted lights based on additive mixture. Therefore, there is proposed a technique in which the diffraction grating is not formed in a region where the black should be expressed, but the region is formed transparently or as a mirror surface to be able to observe the black. However, because the color expression based on subtractive mixture is usually adopted in printing with a generally-used printer, white-background paper or card is frequently used as a transferred base material. When a color diffraction grating image is formed in the white-background transfer base material, such a problem could happens as the white-background is directly seen in a portion in which the diffraction grating is not formed, and an image different from the intended color image is formed.

In view of the foregoing, an object of the invention is to provide an image forming method of forming a full-color diffraction grating image in which the black can be expressed in addition to colors expressed by the diffracted light and an image display body formed by the image forming method.

Means for Solving the Problem

In order to solve the problem, the present invention provides an image forming method of forming a color image on a predetermined base material expressing colors to be expressed for each pixel by a combination of luminances of color corresponding to each of a plurality of diffraction gratings and black ink, by transferring each of the diffraction gratings is transferred from a transfer sheet in which the plurality of diffraction gratings are laminated on the base material, the plurality of diffraction gratings being different from each other in a color of diffracted light observed in a particular direction, and forming a black ink layer being constituted black ink.

In the image forming method according to the present invention, because the black ink is formed on the base material, the black which is not obtained by the combination of the diffracted lights can be expressed irrespective of the color of the base material. Additionally, the light is absorbed by the black ink, so that each color expressed by the combination of the diffracted lights can clearly be observed. Any diffraction grating may be used as the plural diffraction gratings as long as each color except black can be expressed by the combination of the diffraction gratings. For example, the use of three diffraction gratings corresponding to red (R), green (G), and blue (B) can express a full-color image. The use of the transfer sheet includes the case where the transfer sheet different for each diffraction grating is used and the case where the transfer sheet in which diffraction gratings are frame-sequentially laminated is used.

The image forming method according to the present invention may comprise a black ink forming process of transferring the black ink layer onto the base material from a black ink transfer sheet having the black ink layer constituted by the black ink; and a diffraction grating forming process of forming the diffraction grating corresponding to the each color on the black ink layer formed on the base material such that luminance of the each color becomes luminance appropriate for the color to be expressed.

Therefore, the full-color image including the black can easily be obtained without the need for gradation expression of the black ink or high print resolution. Either thermal transfer or sublimation transfer may be adopted as a method for transferring the black ink. Because each diffraction grating is transferred in a halftone dot shape, the luminance is adjusted by area gradation such that the luminance is obtained appropriately for the color to be expressed. Any well-known method may be used as the method for adjusting the luminance.

The image forming method according to the present invention may comprise a diffraction grating forming process of forming a diffraction grating corresponding to the each color on the base material such that luminance of the each color becomes luminance appropriate for the color to be expressed; and a black ink forming process of forming the black ink layer on the base material by using a black ink transfer sheet having the black ink layer constituted by the black ink such that gaps between the plurality of diffraction gratings to be provided on the base material appropriately for the color to be expressed are filled with the black ink layer.

In the above image forming method, each of the diffraction gratings is formed on the base material by the well-known method, and the portion in which any diffraction grating is not formed is filled with the black ink. Therefore, the full-color image including the black can be formed. Usually resolution for forming the black ink is higher than resolution for forming the diffraction grating, so that the finer gradation expression can be realized. Either the thermal transfer or the sublimation transfer may be adopted as the method for forming the black ink. The gradation expression of the black ink formed on the base material is performed by area gradation or density gradation to form the desired color image. The diffraction grating forming process and the black ink forming process may be performed in any order.

Moreover, the image forming method according to the invention may comprise a diffraction grating forming process of forming the each diffraction grating on the base material such that each pixel of the color image is filled with the plurality of diffraction gratings; and a black ink forming process of forming the black ink layer on the each diffraction grating by using a black ink transfer sheet having the black ink layer constituted by the black ink such that luminance of the color corresponding to the each diffraction grating formed on the base material becomes luminance appropriate for the color to be expressed.

In the above image forming method, the color to be expressed of each pixel is expressed by adjusting to the diffraction grating which has been formed such that the pixel is filled with the diffraction grating, the luminance of the color corresponding to each diffraction grating by the gradation of the black ink. Because the diffraction grating is formed in each pixel, the region where the diffraction grating is not formed does not exist, and the color of the base material is not seen. It is enough that each of the plural diffraction gratings formed in the pixel can express the color to be finally expressed by adjusting the luminance with the black ink. Each of the plural diffraction gratings maybe formed in equal area, or the diffraction gratings may be formed in unequal area. Any method may be used as the method for forming the diffraction gratings. Either the thermal transfer or the sublimation transfer may be adopted as the black ink forming method. The luminance is adjusted by the area gradation in the case of the thermal transfer, and the luminance is adjusted by the density gradation in the case of the sublimation transfer.

Additionally, the present invention may be realized as an image display body formed by the above mentioned image forming methods.

EFFECT OF THE INVENTION

Thus, the invention can provide the image forming method and the like for forming a full-color image in which, in addition to colors expressed by the diffracted light, the black can be expressed by forming the black ink on the base material along with the plural diffraction gratings.

BEST MODE FOR CARRYING OUT THE INVENTION

Figure 1:
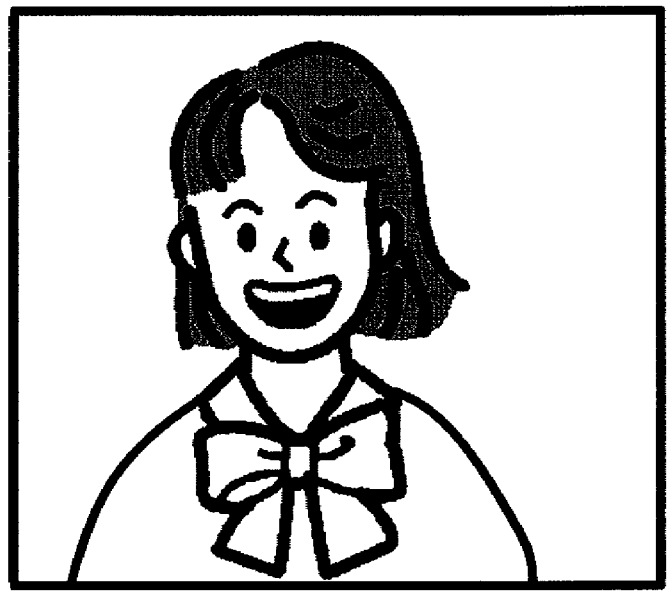
FIG. 1 is a view showing a color image as an image display body according to the invention.

FIG. 1 is a view showing a color image A as an image display body according to the invention. The color image A is a full-color diffraction grating image, in which the color is expressed by a combination of a diffraction grating R, a diffraction grating G, and a diffraction grating B as the plural diffraction gratings and the black is expressed by a black ink. The diffraction grating R, the diffraction grating G, and the diffraction grating B are diffraction gratings whose colors of the diffracted lights in a particular observation direction are red, green, and blue respectively. Hereinafter the diffraction grating R, diffraction grating G, and diffraction grating B are referred to as diffraction grating RGB unless particularly distinguished from each other. Three kinds of color images A and forming methods thereof will be described below. The three kinds of color images A each of which has different from each other the embodiment as the color diffraction grating image in which the black ink is provided.

1. First Embodiment

Figure 2:
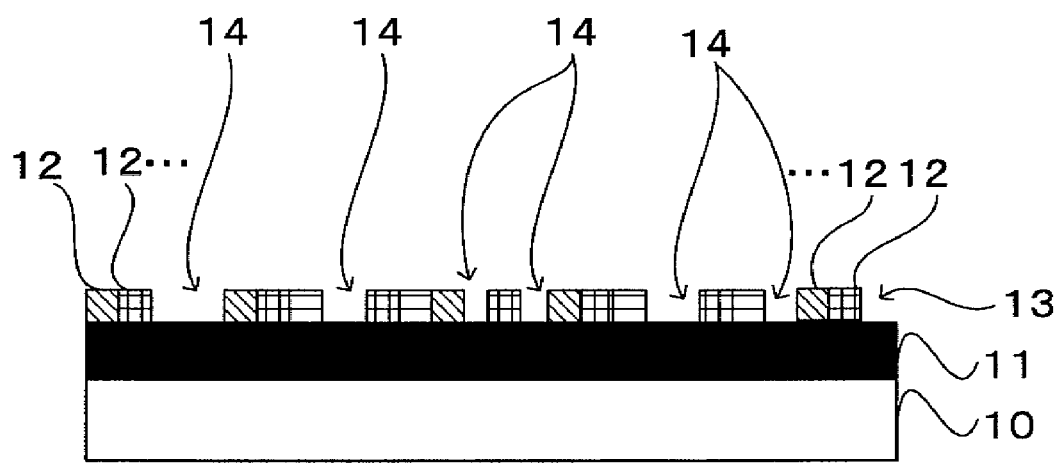
FIG. 2 is a sectional view of a color image of a first embodiment.

In the color image A of a first embodiment, as shown in FIG. 2, a black ink layer 11 is laminated on a base material 10, and a diffraction grating layer 13 is laminated on the black ink layer 11. The diffraction grating layer 13 is formed by halftone dots 12 of the plural diffraction gratings RGB. In a portion 14 in which any diffraction grating RGB is not formed, the black ink layer 11 is an upper-most layer. Therefore, the portion 14 in which the diffraction grating RGB is not formed is seen as filled with the black ink when the color image A is viewed from a front face.

Figure 3A:
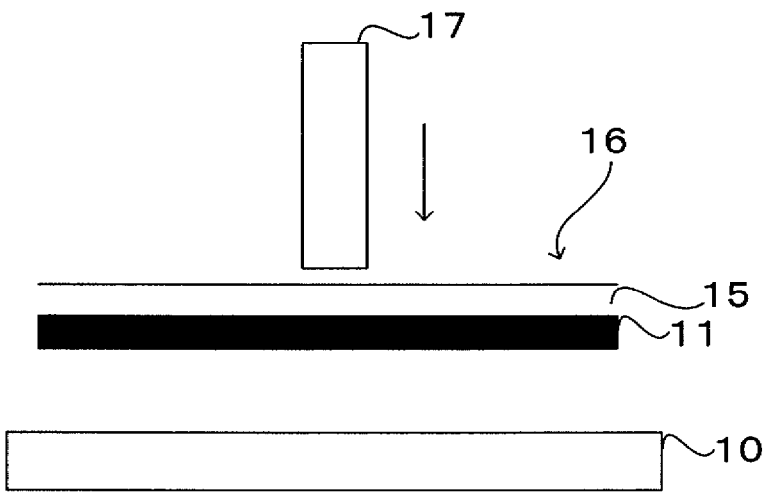
FIG. 3A is a view showing a state in which a black ink layer is transferred in the first embodiment.
Figure 3B:
FIG. 3B is a sectional view showing a state in which the black ink layer is formed on a base material.

Then, a method of forming the color image A in the first embodiment will be described. In the image forming method of the first embodiment, firstly a black ink forming process is performed, and then a diffraction grating forming process is performed. As shown in FIG. 3A, in the black ink forming process, the black ink layer 11 constituted by the black ink is transferred to the whole of the base material 10 by pressing a thermal head 17 against a black ink transfer sheet 16, where the black ink layer 11 is laminated on a base material sheet 15. The color of the base material 10 is not particularly limited. For example, the white-background base material used in a general printing may be used as the base material 10. FIG. 3B shows the state in which the black ink layer 11 is transferred onto the base material 10.

Figure 4:
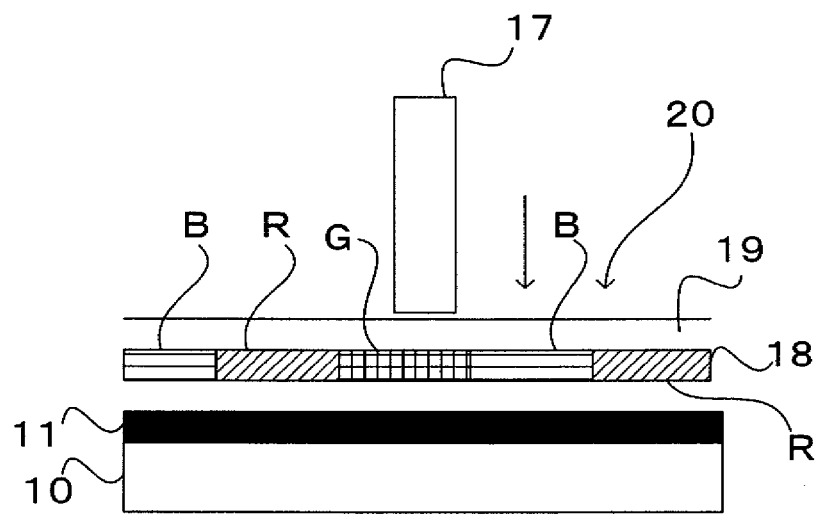
FIG. 4 is a view showing a diffraction grating forming process in the first embodiment.

As shown in FIG. 4, a diffraction grating transfer sheet 20 is used in the diffraction grating forming process. In the diffraction grating transfer sheet 20, a diffraction grating forming layer 18 in which the diffraction grating R, the diffraction grating G, and the diffraction grating B are frame-sequentially formed is laminated on a base material sheet 19. The thermal head 17 is pressed against the diffraction grating transfer sheet 20 to transfer the diffraction grating forming layer 18 to the black ink layer 11 such that the diffraction grating RGB corresponding to each of the red, green, and blue is formed in a halftone dot shape on the black ink layer 11 with an area ratio appropriate for the color to be expressed of each pixel.

The area ratio appropriate for the color to be expressed of the diffraction grating RGB can be obtained by the well-known method. For example, a luminance of original data is reduced to one-thirds, the color of each pixel is resolved into RGB, and the area ratio of each diffraction grating is obtained appropriately for the luminance of the resolved RGB. In the case where the area ratio of 100% is related to the luminance of 100 while the area ratio of 0% is related to the luminance of 0, when the luminances of R, G, and B are values of 100, 50, and 25 respectively, the area ratios of the diffraction grating R, the diffraction grating G, and the diffraction grating B become 100%, 50%, and 25% respectively. The operation of the thermal head 17 can be controlled such that the diffraction grating RGB is formed on the black ink layer 11 by the area ratio obtained for each pixel.

The color image A of the first embodiment shown in FIG. 2 can be obtained by the above-described method. As described above, because the black ink layer 11 becomes the upper-most layer in the portion 14 in which any diffraction grating RGB is not formed, the color of the base material 10 is not directly seen. Additionally, the light is absorbed by the black, so that each color expressed by the combination of the diffraction gratings RGB can be clearly expressed.

2. Second Embodiment

Figure 5:
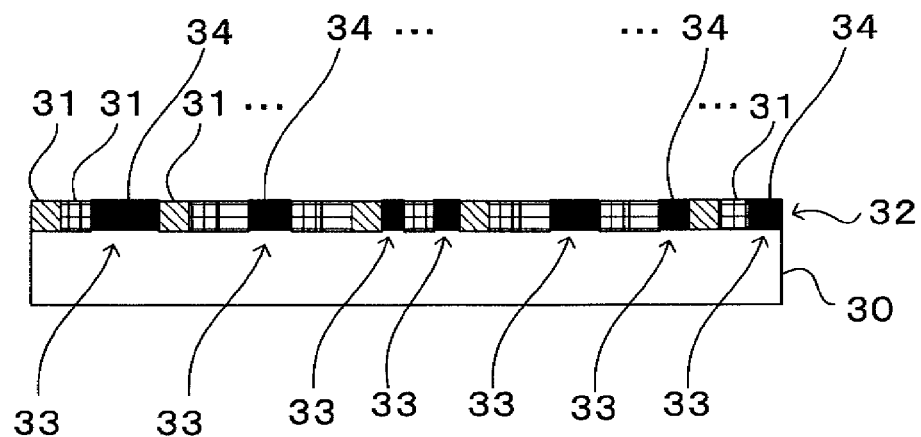
FIG. 5 is a sectional view of a color image of a second embodiment.

In the color image A in a second embodiment of the invention, as shown in FIG. 5, a diffraction grating layer 32 is formed on a base material 30, and the diffraction grating layer 32 is constituted by plural halftone dots 31 of the diffraction grating RGB. A black ink 34 is provided in a portion 33 of the diffraction grating layer 32, in which any diffraction grating RGB is not formed, such that the portion 33 is filled with the black ink 34.

Figure 6A:
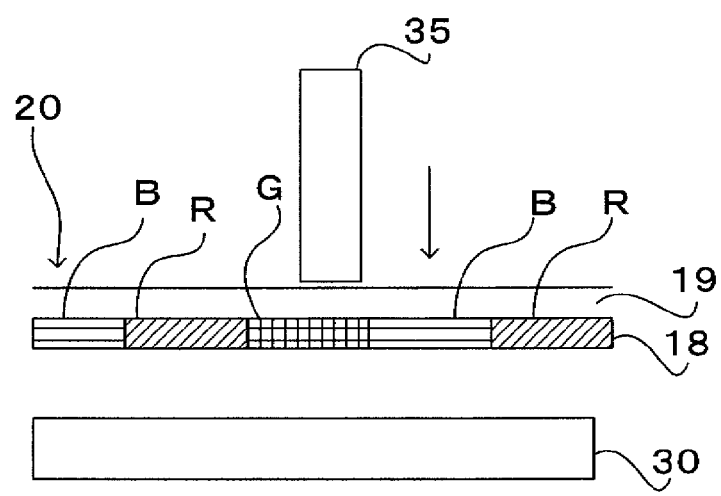
FIG. 6A is a view showing a state in which a diffraction grating forming layer is transferred in the second embodiment.
Figure 6B:
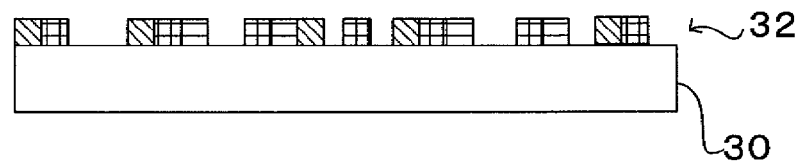
FIG. 6B is a sectional view showing a state in which the diffraction grating forming layer is formed in a halftone dot shape.

A method of forming the color image A in the second embodiment shown in FIG. 5 will be described below. In the image forming method of the second embodiment, firstly a diffraction grating forming process is performed, and then a black ink forming process is performed. However, the processes may be performed in the reverse order. As shown in FIG. 6A, in the diffraction grating forming process, the diffraction grating forming layer 18 is transferred onto the base material 30 by pressing a thermal head 35 against the diffraction grating transfer sheet 20 which has the same construction as the first embodiment. The diffraction grating forming layer 18 can be transferred appropriately for the color to be expressed for each pixel in the manner similar to that of the first embodiment. FIG. 6B shows the state in which each diffraction grating RGB is transferred onto the base material 30 in the halftone dot shape to form the diffraction grating layer 32. The color of the base material 30 is not particularly limited, but the usually-used white-background base material may be adopted.

Figure 7:
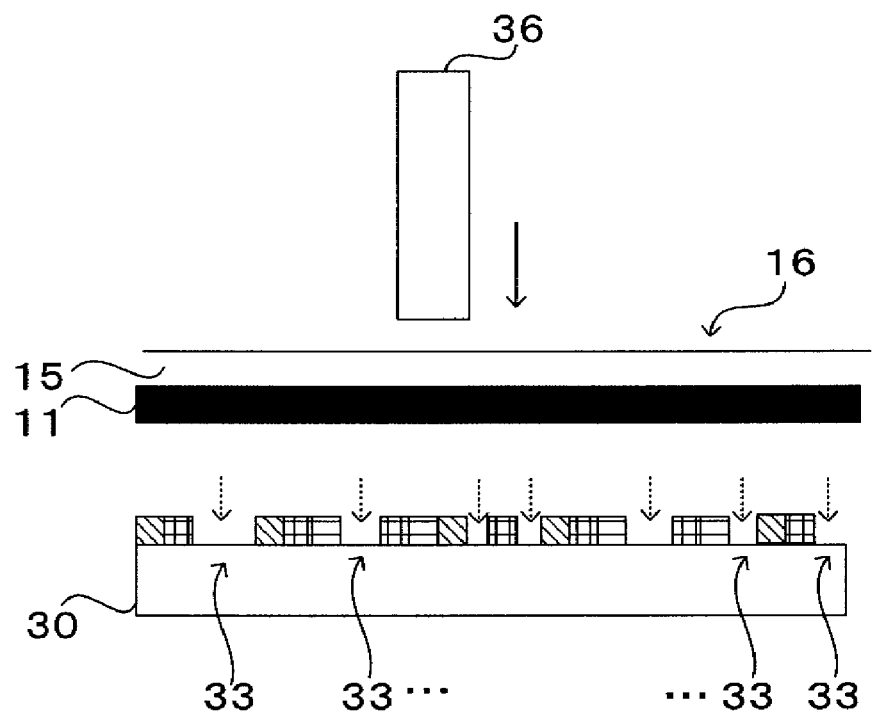
FIG. 7 is a view showing a black ink forming process in the second embodiment.

As shown in FIG. 7, in the black ink forming process, the black ink layer 11 is transferred to the portion 33 in which the diffraction grating RGB is not formed by using the black ink transfer sheet 16 having the same construction as the first embodiment. Although a thermal head 36 is the same as the thermal head 35 used in the diffraction grating forming process, the thermal head 36 can perform the resolution of the black ink can be higher than the resolution of the diffraction grating due to the difference of a ribbon material. In this case, the resolution of the thermal head is set to the black ink side on which the finer image can be formed.

The color image A of the second embodiment shown in FIG. 5 can be obtained by the above-described method. As described above, because the black ink 34 is formed in the portion 33 in which any diffraction grating RGB is not formed, the color of the base material 30 is not directly seen. Additionally, the light is absorbed by the black, so that each color expressed by the combination of the diffraction gratings RGB can be clearly expressed.

3. Third Embodiment

Figure 8:
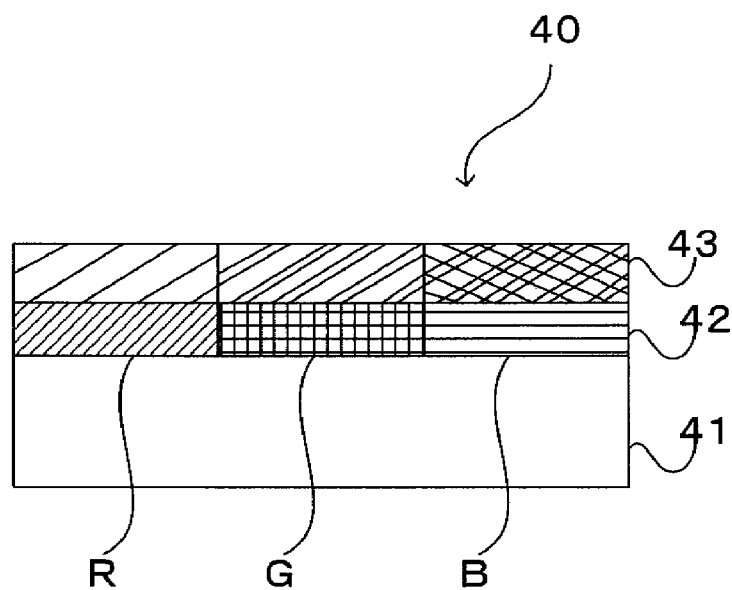
FIG. 8 is a sectional view of pixels constituting a color image in a third embodiment.

As shown in FIG. 8, a pixel 40 of the color image A in a third embodiment of the invention is formed by sequentially laminated a base material 41, a diffraction grating layer 42, and a black ink layer 43. The diffraction grating R, the diffraction grating G, and the diffraction grating B are provided in the diffraction grating layer 42. The black ink layer 43 is constituted by the black ink. Each diffraction grating RGB in the diffraction grating layer 42 is formed such that each region where the pixel 40 is equally divided into three is filled with the diffraction grating RGB, namely, the diffraction grating RGB is formed with the area ratio of 100%. The black ink layer 43 is formed by sublimation transfer, and the black ink layer 43 has density gradation of the black ink.

In FIG. 8, the black ink provided on the diffraction grating R has the lowest density, and the black ink provided on the diffraction grating B has the highest density. The luminances of the colors corresponding to the diffraction grating RGB located below are adjusted by the density of the black ink. The color to be expressed in the pixel 40 is expressed by the combination of the colors the luminances of which are adjusted. Other pixels have the configuration similar to that of the pixel 40 only except that the density of the black ink is different appropriately for the color to be expressed.

Figure 9A:
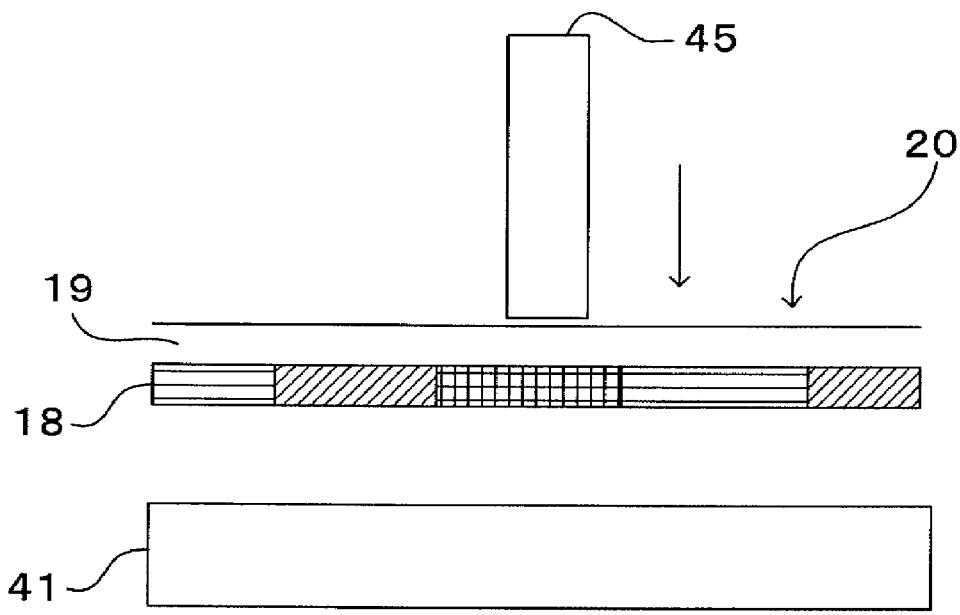
FIG. 9A is a view showing a state in which a diffraction grating forming layer is transferred in the third embodiment.
Figure 9B:
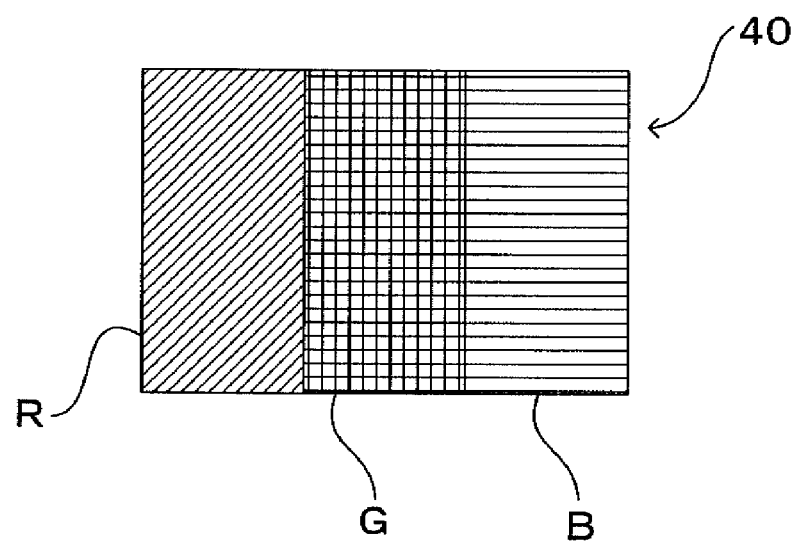
FIG. 9B is a front view showing a pixel in which plural diffraction gratings are formed.

A method of forming the color image A in the third embodiment will be described below. In the image forming method of the third embodiment, firstly a diffraction grating forming process is performed, and then a black ink forming process is performed. As shown in FIG. 9A, in the diffraction grating forming process, the diffraction grating forming layer 18 is transferred onto the base material 41 by pressing a thermal head 45 against the diffraction grating transfer sheet 20 having the same construction as the first and second embodiments. In the third embodiment, as shown in FIG. 9B, each diffraction grating RGB is transferred with the area ratio of 100% to each region obtained by equally dividing the pixel into three. Therefore, the base material 41 is filled with the diffraction grating ROB. The color of the base material 41 is not particularly limited, but the usually-used white-background base material may be adopted.

Figure 10:
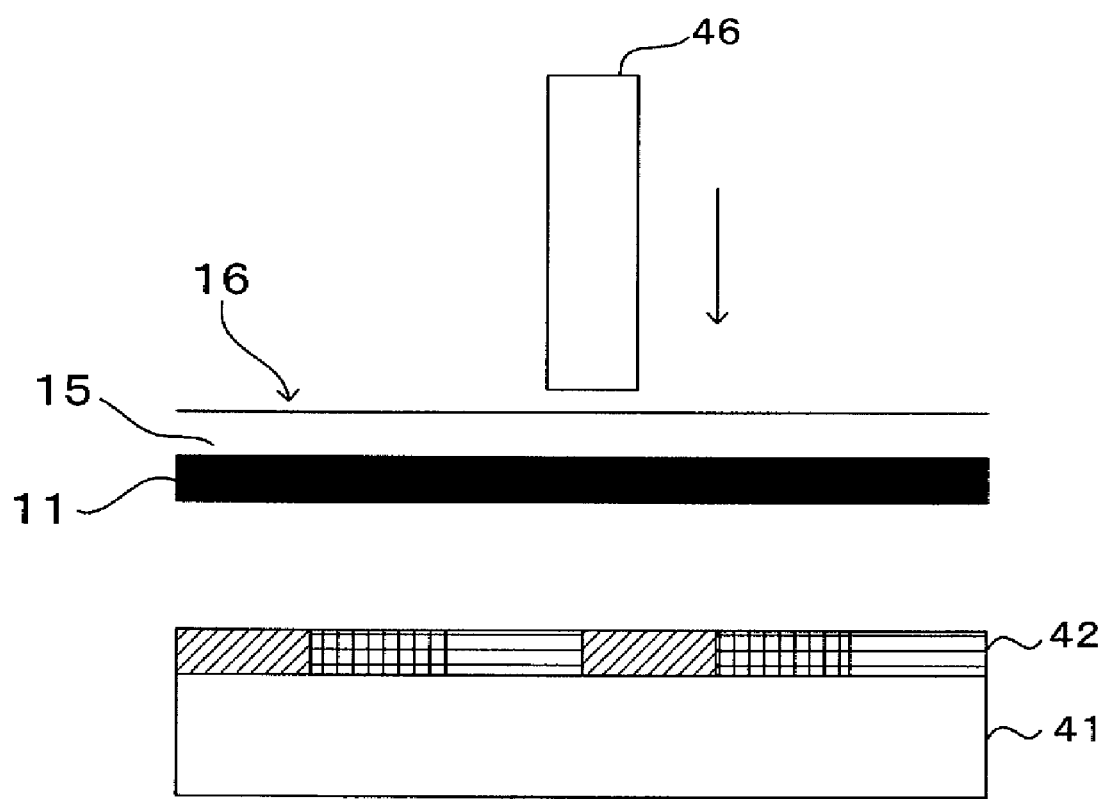
FIG. 10 is a view showing a diffraction grating forming process in the third embodiment.

As shown in FIG. 10, in the black ink forming process, a thermal head 46 is pressed against the black ink transfer sheet 16 having the same construction as the first and second embodiments, and the black ink layer 11 is sublimation-transferred onto the diffraction grating layer 42 formed on the base material. Because the luminance of each diffraction grating RGB is decided appropriately for the color to be expressed in each pixel, the density of the black ink provided in each diffraction grating RGB is adjusted such that each diffraction grating RGB on the base material 41 becomes the decided luminance.

In the case where the original image is duplicated, the color of each pixel is resolved into RGB to decide the luminance of each color of RGB. Therefore, the luminance of each diffraction grating RGB can be decided for each pixel 40 appropriately for the color to be expressed, and the density, i.e., an amount of the black ink to be sublimated on each diffraction grating RGB can be adjusted such that each color becomes the decided luminance.

The color image A of the third embodiment shown in FIG. 8 can be obtained by the above-described method. As described above, because the diffraction grating RGB is formed over the whole base material 41, the color of the base material 41 is not directly seen. Additionally, the light is absorbed by the black, so that each color expressed by the combination of the diffraction gratings RGB can be clearly expressed.

The invention is not limited to the above embodiments, but the invention may be made in various modes. In the above embodiments, the halftone dot of the diffraction grating R, the halftone dot of the diffraction grating G, and the halftone dot of the diffraction grating B are formed so as not to overlap each other. Alternatively, the halftone dot of the diffraction grating R, the halftone dot of the diffraction grating G, and the halftone dot of the diffraction grating B may be formed so as to overlap each other. A release layer, a bonding layer, and a rear-side lubricant layer may be provided in the black ink transfer sheet 16 and the diffraction grating transfer sheet 20 if needed.

In the black ink forming process in the third embodiment, the black ink may be transferred by thermal transfer. In this case, the luminance of each diffraction grating RGB is adjusted by area gradation of the black ink. For the pixel having the luminance of 0 in the original image, it is not necessary that the diffraction grating RGB be transferred.

The invention claimed is:

1. An image forming method of forming a color image on a predetermined base material expressing a color to be expressed for each pixel by a combination of luminances of color corresponding to each of a plurality of diffraction gratings and black ink, by transferring each of the diffraction gratings is transferred from a transfer sheet in which the plurality of diffraction gratings are laminated on the base material, the plurality of diffraction gratings being different from each other in a color of diffracted light observed in a particular direction, and forming a black ink layer being constituted black ink, wherein the image forming method comprises:
    a black ink forming process of transferring the black ink layer onto the base material from a black ink transfer sheet having the black ink layer constituted by the black ink such that the black ink layer covers an area of the base material corresponding to the color image; and
    a diffraction grating forming process of forming the diffraction grating corresponding to the each color on the black ink layer formed on the base material such that luminance of the each color becomes luminance appropriate for the color to be expressed.

2. An image forming method of forming a color image on a predetermined base material expressing a color to be expressed for each pixel by a combination of luminances of color corresponding to each of a plurality of diffraction gratings and black ink, by transferring each of the diffraction gratings is transferred from a transfer sheet in which the plurality of diffraction gratings are laminated on the base material, the plurality of diffraction gratings being different from each other in a color of diffracted light observed in a particular direction, and forming a black ink layer being constituted black ink, wherein the image forming method comprises:
    a diffraction grating forming process of forming a diffraction grating corresponding to the each color on the base material such that luminance of the each color becomes luminance appropriate for the color to be expressed; and
    a black ink forming process of forming the black ink layer on the base material by using a black ink transfer sheet having the black ink layer constituted by the black ink such that gaps between the plurality of diffraction gratings to be provided on the base material appropriately for the color to be expressed are filled with the black ink layer.

3. An image forming method of forming a color image on a predetermined base material expressing a color to be expressed for each pixel by a combination of luminances of color corresponding to each of a plurality of diffraction gratings and black ink. by transferring each of the diffraction gratings is transferred from a transfer sheet in which the plurality of diffraction gratings are laminated on the base material, the plurality of diffraction gratings being different from each other in a color of diffracted light observed in a particular direction, and forming a black ink layer being constituted black ink, wherein the image forming method comprises
    a diffraction grating forming process of forming the each diffraction grating on the base material such that each pixel of the color image is filled with the plurality of diffraction gratings; and
    a black ink forming process of forming the black ink layer on the each diffraction grating formed on the base material by using a black ink transfer sheet having the black ink layer constituted by the black ink such that the diffraction gratings are covered by the black ink and luminance of the color corresponding to the each diffraction grating formed on the base material becomes luminance appropriate for the color to be expressed.

4. An image display body which is formed by the image forming method according to claim 1.

5. An image display body which is formed by the image forming method according to claim 2.

6. An image display body which is formed by the image forming method according to claim 3.

* * * * *